United States Patent
Wang et al.

(10) Patent No.: US 10,129,966 B2
(45) Date of Patent: Nov. 13, 2018

(54) BACKLIGHT MODULE, DISPLAY DEVICE AND METHOD FOR MANUFACTURING THE DISPLAY DEVICE

(71) Applicants: BOE Technology Group Co., Ltd., Beijing (CN); Beijing BOE Optoelectronics Technology Co., Ltd., Beijing (CN)

(72) Inventors: Jiaqiang Wang, Beijing (CN); Rui Liu, Beijing (CN); Quanzhong Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/098,506

(22) Filed: Apr. 14, 2016

(65) Prior Publication Data

US 2017/0055335 A1    Feb. 23, 2017

(30) Foreign Application Priority Data

Aug. 19, 2015    (CN) .......................... 2015 1 0512979

(51) Int. Cl.
*G09F 13/04*    (2006.01)
*H05F 3/00*    (2006.01)
(Continued)

(52) U.S. Cl.
CPC .............. *H05F 3/00* (2013.01); *H05K 1/028* (2013.01); *H05K 1/0259* (2013.01); *H05K 1/09* (2013.01);
(Continued)

(58) Field of Classification Search
CPC .......... H05F 3/00; H05K 1/09; H05K 1/0259; H05K 1/11; H05K 1/028;
(Continued)

(56) References Cited

U.S. PATENT DOCUMENTS

| 8,434,884 | B2 | 5/2013 | Chiu et al. | |
| 2010/0265430 | A1 | 10/2010 | Xu | |
| 2013/0240917 | A1 | 9/2013 | Cho et al. | |
| 2014/0152931 | A1* | 6/2014 | Li | H01L 29/786 349/42 |
| 2014/0177176 | A1* | 6/2014 | Torii | H05K 1/0259 361/748 |

(Continued)

FOREIGN PATENT DOCUMENTS

| CN | 101866069 A | 10/2010 |
| CN | 101963298 A | 2/2011 |

(Continued)

OTHER PUBLICATIONS

First Office Action, including Search Report, for Chinese Patent Application No. 201510512979.5, dated Jan. 10, 2017, 11 pages.

(Continued)

*Primary Examiner* — Evan Dzierzynski
*Assistant Examiner* — Omar Rojas Cadima
(74) *Attorney, Agent, or Firm* — Westman, Champlin & Koehler, P.A.

(57) ABSTRACT

Embodiments of the present invention relate to a backlight module, a display device and a method for manufacturing the display device. The backlight module includes: a backlight module body and a conductive light-shielding adhesive for bonding the backlight module body and a display panel, the backlight module body is provided with a connecting wire for electrically connecting to the display panel circuit board arranged on the display panel, the display panel circuit board is provided with a ground terminal. According to the present invention, static electricity on the display panel may flow to the ground terminal through the conductive light-shielding adhesive, the backlight module body and the display panel circuit board, by providing the conductive (Continued)

light-shielding adhesive and the connecting wire on the backlight module, such that the effects of increasing the static electricity protection capability to the backlight module and the life of the display panel are achieved.

6 Claims, 3 Drawing Sheets

(51) Int. Cl.
 *H05K 1/02* (2006.01)
 *H05K 1/09* (2006.01)
(52) U.S. Cl.
 CPC .............. *H05K 2201/10106* (2013.01); *H05K 2201/10128* (2013.01)
(58) Field of Classification Search
 CPC .......... H05K 2201/10128; H05K 2201/10106; H05B 33/06
 USPC ........... 362/97.1, 630, 631; 349/56; 361/600
 See application file for complete search history.

(56) References Cited

U.S. PATENT DOCUMENTS

2016/0291382 A1 10/2016 Chai

FOREIGN PATENT DOCUMENTS

| CN | 102011979 A | 4/2011 |
|---|---|---|
| CN | 202013461 U | 10/2011 |
| CN | 202979442 U | 6/2013 |
| CN | 103593087 A | 2/2014 |
| CN | 204155239 U | 2/2015 |
| CN | 104536184 A | 4/2015 |
| CN | 104698636 A | 6/2015 |
| CN | 104730746 A | 6/2015 |
| CN | 104834120 A | 8/2015 |

OTHER PUBLICATIONS

Second Office Action from Chinese Patent Application No. 201510512979.5, dated Jul. 12, 2017, 14 pages.
Third Office Action, including Search Report, for Chinese Patent Application No. 201510512979.5, dated Jan. 19, 2018, 14 pages.

\* cited by examiner

BACKLIGHT MODULE, DISPLAY DEVICE AND METHOD FOR MANUFACTURING THE DISPLAY DEVICE

CROSS-REFERENCE TO RELATED APPLICATION

This application claims the benefit of Chinese Patent Application No. 201510512979.5 filed on Aug. 19, 2015 in the State Intellectual Property Office of China, the whole disclosure of which is incorporated herein by reference.

FIELD OF THE INVENTION

Embodiments of the present invention relates to the field of display technology, especially to a backlight module, a display device and a method for manufacturing the display device.

BACKGROUND OF THE INVENTION

With the development of technology, people's daily life becomes increasingly dependent on a variety of display devices. Therefore, people's requirements for the static protection capability of the display device are also getting higher and higher.

There is provided a display device in the related art which comprises components such as a display panel and a backlight module. A circuit construction is provided in the display panel. Static electricity may be created on the surface of the display panel due to the electrical induction between the electrical components and environmental factors when the display panel is electrified.

The inventor found that the static electricity created on the surface of the display panel may damage to the internal circuit of the display panel and other components in the display device, reducing the service life of the display panel.

SUMMARY OF THE INVENTION

The present invention has been made to overcome or alleviate the disadvantage that the static electricity created on the surface of the display panel may damage to the internal circuit of the display panel and other components in the display device and reduce the service life of the display panel.

Accordingly, embodiments of the present invention provide a backlight module, a display device and a method for manufacturing the display device.

According to a first aspect of the present invention, there is provided a backlight module, comprising:

A backlight module body and a conductive light-shielding adhesive for bonding the backlight module body and a display panel, the backlight module body is provided with a connecting wire for electrically connecting to a display panel circuit board provided on the display panel, the display panel circuit board is provided with a ground terminal, so that static electricity on the display panel may flow to the ground terminal through the conductive light-shielding adhesive, the backlight module body and the display panel circuit board.

Optionally, the backlight module body comprises a light bar circuit board, and the conductive light-shielding adhesive is bonded with the light bar circuit board.

Optionally, the light bar circuit board is provided with a copper leakage, and the copper leakage is bonded with the conductive light-shielding adhesive.

Optionally, the light bar circuit board is provided with the connecting wire, and the copper leakage is electrically connected with the connecting wire which may be electrically connected with the display panel circuit board through a bonding pad.

Optionally, the copper leakage covers the light bar circuit board.

Optionally, the light bar circuit board is a flexible printed circuit board.

According to a second aspect of the present invention, there is provided a display device, which comprises the backlight module according to the first aspect of the present invention.

According to a third aspect of the present invention, there is provided a method for manufacturing a display device, wherein the display device comprises a display panel and a backlight module which has a backlight module body and a conductive light-shielding adhesive, the backlight module body being provided with a connecting wire, and a display panel circuit board being provided on the display panel, the method comprises the steps as follows:

bonding the display panel with the backlight module body through the conductive light-shielding adhesive;

electrically connecting the connecting wire of the backlight module body with the display panel circuit board, wherein the display panel circuit board is provided with a ground terminal, so that static electricity on the display panel may flow to the ground terminal through the conductive light-shielding adhesive, the backlight module body and the display panel circuit board.

Optionally, the backlight module body comprises a light bar circuit board which is provided with a copper leakage, and the step of bonding the display panel with the backlight module body through the conductive light-shielding adhesive comprises bonding the display panel with the copper leakage through the conductive light-shielding adhesive.

It should be noted that the above summary and following detail description are only exemplary and explanatory, which should not limit the present invention.

BRIEF DESCRIPTION OF THE DRAWINGS

Drawings herein are incorporated in and constitute a part of this specification, illustrate embodiments of the invention, and are intended to explain the principles of the invention together with the description, in which:

FIG. 2-1 is a structure schematic view of another backlight module of another embodiment of the present invention;

FIG. 2-2 is a bottom view of the backlight module shown in FIG. 2-1.

DETAILED DESCRIPTION OF PREFERRED EMBODIMENTS OF THE INVENTION

Figure 1:
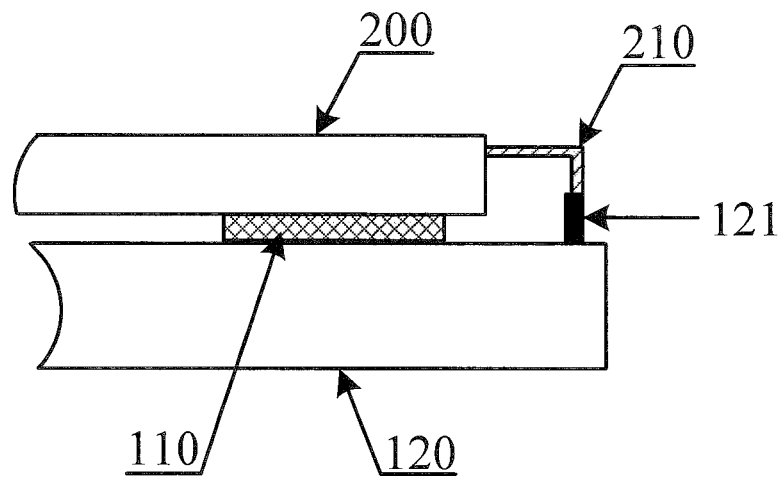
FIG. 1 is a structure schematic view of a backlight module of an embodiment of the present invention.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

FIG. 1 is a structure schematic view of a backlight module of an embodiment of the present invention. The backlight module may comprises: a backlight module body 120 and a conductive light-shielding adhesive 110 for bonding the backlight module body 120 and a display panel 200. The backlight module body 120 is provided with a connecting wire 121 for electrically connecting to the display panel circuit board 210 arranged on the display panel 200. The display panel circuit board 210 is provided with a ground terminal, so that static electricity on the display panel 200 may flow to the ground terminal through the conductive light-shielding adhesive 110, the backlight module body 120 and the display panel circuit board 210. The display panel 300 and the display panel circuit board 210 may not be necessarily included in the backlight module of the embodiments of the present invention.

By providing the conductive light-shielding adhesive and the connecting wire on the backlight module according to the embodiment of the present invention, static electricity on the display panel may flow to the ground terminal through the conductive light-shielding adhesive, the backlight module body and the display panel circuit board, such that the problem in the art that static electricity created on the surface of the display panel will reduce the service life of the display panel is solved and the static electricity protection capability to the backlight module and the life of the display panel can be achieved.

Figures 1, 2:
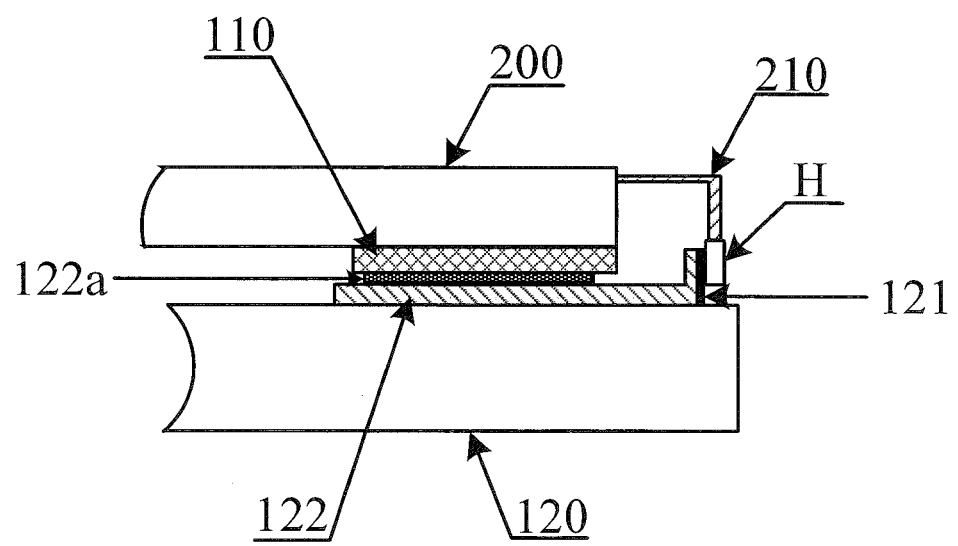
Figure 2:
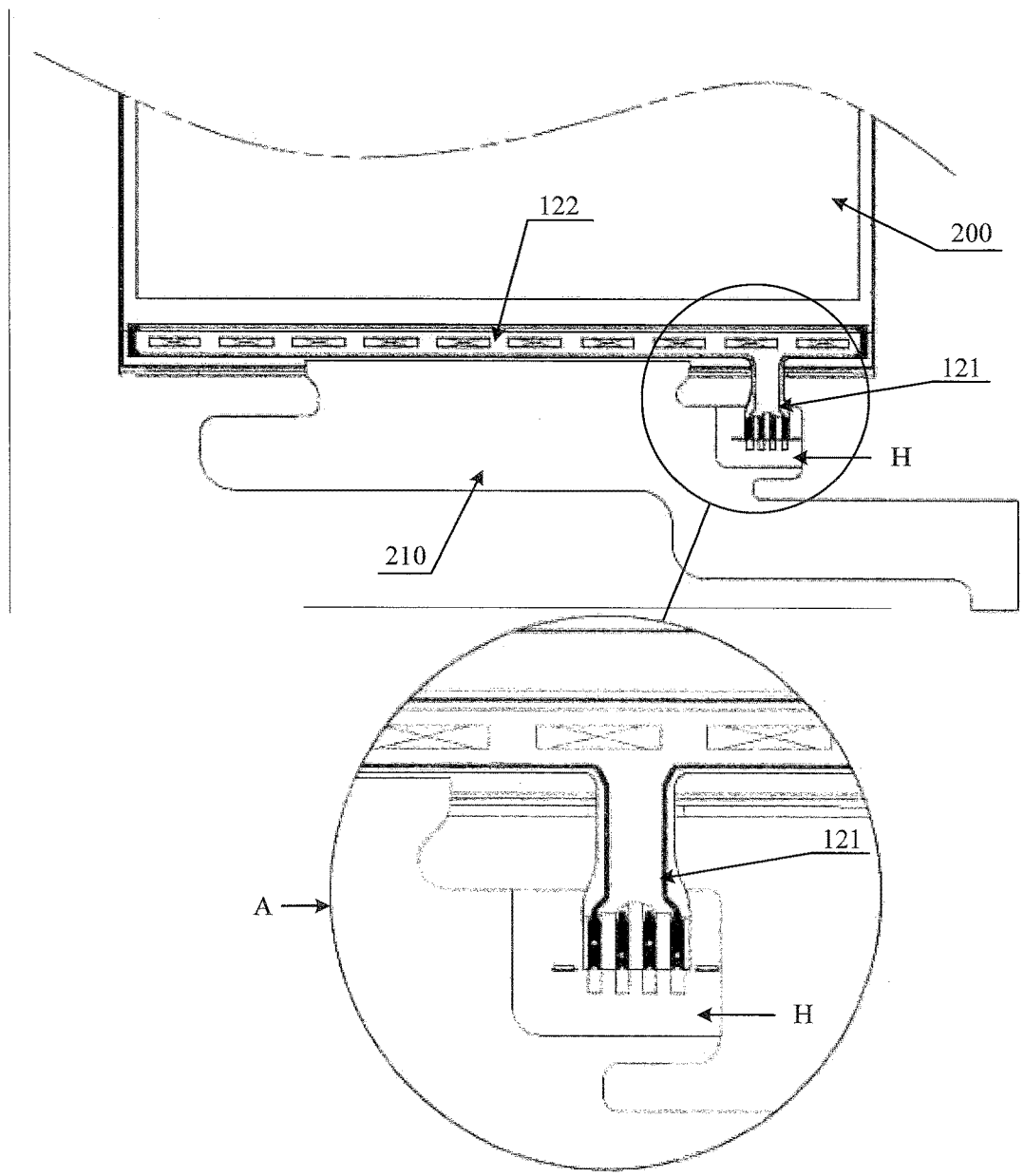

Further referring to FIG. 2-1, which shows a structure schematic view of another backlight module of an embodiment of the present invention, an optional component is added on basis of the backlight module shown in FIG. 1, so that the backlight module of the embodiment of the present invention will have a better performance.

Optionally, the backlight module body 120 comprises a light bar circuit board 122, and the conductive light-shielding adhesive 100 is bonded with the light bar circuit board 122. Here, the light bar circuit board 122 may be used to provide backlight source.

Optionally, the light bar circuit board 122 is provided with a copper leakage 122a, and the copper leakage 122a is bonded with the conductive light-shielding adhesive 110. The conductive light-shielding cohesive 110 may be a conductive light-shielding tape of a filler type which consists of a matrix and a conductive filler, or the conductive light-shielding cohesive 110 be a conductive light-shielding tape of a matrix type which consists of a conductive matrix.

Optionally, the light bar circuit board 122 is provided with the connecting wire 121, and the copper leakage 122a is electrically connected with the connecting wire 121 which may be electrically connected with the display panel circuit board 210 through a bonding pad H. The copper leakage 122a and the connecting wire 121 may be arranged on two sides of the light bar circuit board 122 and connected to each other through a via hole in the light bar circuit board 122.

Optionally, the copper leakage 122a covers the light bar circuit board 122. That is to say, all the contact face of the light bar circuit board 122 with the conductive light-shielding adhesive 110 may be covered with the copper leakage 122a as a whole. As such, the electrical conductivity can be increased between the conductive light-shielding adhesive 110 and the light bar circuit board 122, which facilitates leading out the static electricity on the display panel 200 by the conductive light-shielding adhesive 110 and enhances electrostatic protection ability to the backlight module.

Optionally, the light bar circuit board 122 is a flexible printed circuit board.

As shown in FIG. 2-2, which is a bottom view of the backlight module shown in FIG. 2-1, the backlight module body is not shown in the FIG. 2-2. In FIG. 2-2, the light bar circuit board 122 is bonded with the display 200 through the conductive light-shielding adhesive (not shown in FIG. 2-2), and the connecting wire 121 on the light bar circuit board 122 is electrically connected with the display panel circuit board 210 through the bonding pad H. The circular area A is an enlarged schematic view of a part of FIG. 2-2, in which the display panel circuit board 210 is a flexible printed circuit.

It should be noted that the display panel 200, the display panel circuit board 210 and the pad H may not be necessarily included in the backlight module of the embodiments of the present invention.

Further, it should be noted that, in the backlight module of the embodiment of the present invention, by covering the copper leakage on the light bar circuit board, the contact area of the copper leakage with the conductive light shielding cohesive is increased, and the electrical conductivity is increased between the conductive light-shielding adhesive and the light bar circuit board, and thus achieve the effect of enhancing electrostatic protection ability to the backlight module.

In summary, by providing the conductive light-shielding adhesive and the connecting wire on the backlight module according to the embodiment of the present invention, static electricity on the display panel may flow to the ground terminal through the conductive light-shielding adhesive, the backlight module body and the display panel circuit board, such that the problem in the art that static electricity created on the surface of the display panel will reduce the service life of the display panel is solved and the static electricity protection capability to the backlight module and the life of the display panel are achieved.

Further, there is provided a display device, which comprises the backlight module as shown in FIG. 1 or FIG. 2-1.

Figure 3:
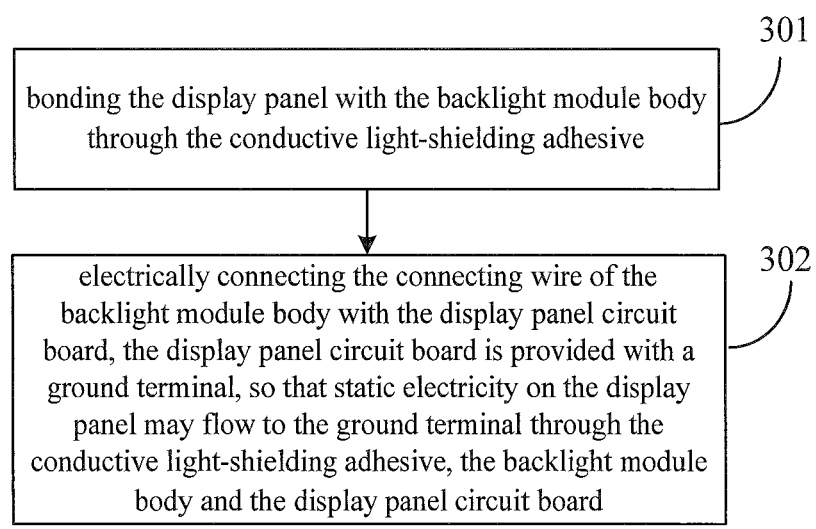
FIG. 3 is a flow chart of the method for manufacturing the display device of the embodiment of the present invention.

FIG. 3 is a flow chart of the method for manufacturing the display device of the embodiment of the present invention. The display device comprises a display panel and a backlight module which has a backlight module body and a conductive light-shielding adhesive, the backlight module body being provided with a connecting wire, and a display panel circuit board being arranged on the display panel. The method for manufacturing the display device comprises following steps, in step 301, bonding the display panel with the backlight module body through the conductive light-shielding adhesive;

when implementing the method for manufacturing the display device of the embodiment of the present invention, firstly, bonding the display panel with the backlight module through the conductive light-shielding adhesive. The display panel may be a liquid crystal display (LCD) panel. The conductive light-shielding cohesive 110 may be a conductive light-shielding tape of a filler type which consists of a matrix and a conductive filler, or the conductive light-shielding cohesive 110 be a conductive light-shielding tape of a matrix type which consists of a conductive matrix.

The backlight module body comprises a light bar circuit board which may be provided with a copper leakage. When bonding the display panel with the backlight module through the conductive light-shielding adhesive, the display panel may be bonded with the copper leakage through the conductive light-shielding adhesive. That is, the static electricity on the display panel may be led into the copper leakage on the light bar circuit board through the conductive light-shielding cohesive.

In the step 302, electrically connecting the connecting wire of the backlight module body with the display panel circuit board. The display panel circuit board is provided with a ground terminal, so that static electricity on the display panel may flow to the ground terminal through the conductive light-shielding adhesive, the backlight module body and the display panel circuit board.

After the display panel is bonded with the backlight module through the conductive light-shielding adhesive, the connecting wire of the backlight module may be electrically connected with the display panel circuit board. The connecting wire on the backlight module can be arranged on the light bar circuit board. The copper leakage on the light bar circuit board and the connecting wire may be arranged on different sides of the light bar circuit board and are connected to each other through a via hole in the light bar circuit board.

Further, a bonding pad may be provided on the display panel circuit board and the connecting wire on the light bar circuit board may be electrically connected with the display panel circuit board through the pad.

After the present step is finished, an instantaneous large current (such as static electricity) created on the display panel can flow to the ground terminal through the conductive light-shielding adhesive, the copper leakage, the connecting wire and the display panel circuit board.

It should be noted that the ground terminal on the display panel circuit board may be connected with a mainboard of the display device (a terminal such as a mobile phone), while the mainboard of the display device may be electrically connected with a case of the display device (such as a mobile phone case), so as to establish a complete release path of the current. That is to say, the current led into the ground terminal on the display panel circuit board may flow to the case of the display device through the mainboard of the display device so as to be released. The specific details have been described in the prior art. It will not be limited by the embodiments of the present invention.

It should be noted additionally that the display device of the embodiments of the present invention may be a mobile terminal such as a mobile phone. When a user is using such kind of the display device, he will frequently touch the display panel, thus an instantaneous large current created on the display panel will threat the safety of user. The display device manufactured by the method according to the embodiment of the present invention will lead the instantaneous large current created on the display panel to the ground terminal, achieving the effect of improving the security of the display device when being used.

It should be noted additionally that the method for manufacturing the display device of the embodiment of the present invention will enhance the ESD protection capability of the display device by changing the structure of the backlight module, without having to set up anti-static circuit in the display panel, which saves the cost for redesigningthe display panel circuit and will not affect the narrow border and slim design of the display panel.

In summary, according to the method for manufacturing the display device of the embodiment of the present invention, by bonding the display panel with the backlight module through the conductive light-shielding adhesive and electrically connecting the connecting wire on the backlight module with the display panel circuit board, static electricity on the display panel may flow to the ground terminal through the conductive light-shielding adhesive, the backlight module body and the display panel circuit board, such that the problem in the art that static electricity created on the surface of the display panel will reduce the service life of the display panel is solved and the static electricity protection capability to the backlight module and the life of the display panel are achieved.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A backlight module, comprising:
   a backlight module body; and
   a conductive light-shielding adhesive configured for bonding the backlight module body and a display panel, wherein
   the backlight module body is provided with a connecting wire for electrically connecting with a display panel circuit board provided on the display panel, and the display panel circuit board is provided with a ground terminal thereon, so that static electricity on the display panel is able to flow into the ground terminal through the conductive light-shielding adhesive, the backlight module body and the display panel circuit board, and
   wherein
   the backlight module body comprises a light bar circuit board, and
   the conductive light-shielding adhesive is boded with the light bar circuit, wherein the light bar circuit board is provided with a copper leakage thereon, and the copper leakage is bonded with the conductive light-shielding adhesive.

2. The backlight module according to claim 1, wherein the light bar circuit board is provided with the connecting wire, and
   the copper leakage is electrically connected with the connecting wire which is able to be electrically connected with the display panel circuit board through a bonding pad.

3. The backlight module according to claim 1, wherein the copper leakage covers the light bar circuit board.

4. The backlight module according to claim 1, wherein the light bar circuit board is a flexible printed circuit board of a light bar.

5. A display device, comprising the backlight module according to claim 1.

6. A method for manufacturing a display device, wherein the display device comprises a display panel and a backlight module, the backlight module comprises a backlight module body and a conductive light-shielding adhesive, the backlight module body being provided with a connecting wire, and a display panel circuit board being provided on the display panel, the method comprises steps:
   bonding the display panel with the backlight module body through the conductive light-shielding adhesive; and
   electrically connecting the connecting wire of the backlight module body with the display panel circuit board, wherein the display panel circuit board is provided with a ground terminal thereon, so that static electricity on the display panel is able to flow into the ground terminal through the conductive light-shielding adhesive, the backlight module body and the display panel circuit board, and wherein
the backlight module body comprises a light bar circuit board, and
the conductive light-shielding adhesive is boded with the light bar circuit, wherein the light bar circuit board is provided with a copper leakage thereon, and
the step of bonding the display panel with the backlight module body through the conductive light-shielding adhesive comprises a step of bonding the display panel with the copper leakage through the conductive light-shielding adhesive.

\* \* \* \* \*